United States Patent [19]

Voss et al.

[11] Patent Number: 4,825,149

[45] Date of Patent: Apr. 25, 1989

[54] CONFORMAL GROUND REFERENCED SELF-INTEGRATING ELECTRIC FIELD SENSOR

[75] Inventors: Donald E. Voss, Cedar Crest; Lynn M. Miner, Kirtland AFB; Kenneth O. Busby, Albuquerque, all of N. Mex.

[73] Assignee: The United States of America as represented by the Secretary of the Air Force, Washington, D.C.

[21] Appl. No.: 137,487

[22] Filed: Dec. 23, 1987

[51] Int. Cl.$^4$ ............................ G01T 1/16; G01T 1/15
[52] U.S. Cl. ....................................... 324/72; 324/72.5
[58] Field of Search ................. 324/72, 72.5, 109, 106

[56] References Cited

U.S. PATENT DOCUMENTS

| | | | |
|---|---|---|---|
| 4,219,804 | 8/1980 | Weischedel | 340/600 |
| 4,277,745 | 7/1981 | Deno | 324/72 |
| 4,336,532 | 6/1982 | Biehl et al. | 340/661 |
| 4,418,314 | 11/1983 | Nieto, Jr. | 324/72.5 |
| 4,422,037 | 12/1983 | Coleman | 324/72 |
| 4,588,993 | 5/1986 | Babij et al. | 343/351 |
| 4,595,876 | 6/1986 | Kuhara et al. | 324/96 |
| 4,642,559 | 2/1987 | Slough | 324/72.5 |

*Primary Examiner*—Reinhard J. Eisenzopf
*Assistant Examiner*—Maura K. Regan
*Attorney, Agent, or Firm*—William G. Auton; Donald J. Singer

[57] ABSTRACT

An electric field sensor which may be used to detect the electromagnetic pulse (EMP) which accompanies a nuclear explosion, as well as other pulsed electric fields, is disclosed. One embodiment of this sensor has been constructed with an overall dimension of less than 5 cm. In general a sensor can be built to conform to an arbitrarily shaped conducting surface such as an airplane surface. Because of this conformity the sensor does not perturb the electric field being measured. By building the probe so that its RC time constant is much greater than the pulse rise time the probe output voltage is self integrated, and produces an output that is proportional to the signal itself rather than to its derivative. The nondifferentiating or self-integrating feature allows full utilization of the sensor/oscilloscope bandpass.

4 Claims, 2 Drawing Sheets

CONFORMAL GROUND REFERENCED SELF-INTEGRATING ELECTRIC FIELD SENSOR

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to electric field sensors, and more particularly to sensors capable of detecting the electromagnetic pulse that accompanies a nuclear explosion.

A precursor to the blast radiation, heat and subsequent radioactive fallout of a nuclear detonation is an electromagnetic pulse (EMP). Various prior art nuclear detonation sensor systems include the use of radiation sensors and seismic sensors (which detect radiation and blast effects) as well as electromagnetic sensors responsive to EMP. Exemplary in the art are the systems of the following U.S. Patents, the disclosures of which are incorporated herein by reference:

U.S. Pat. No. 4,219,804 issued to Weischedel;
U.S. Pat. No. 4,277,745 issued to Deno;
U.S. Pat. No. 4,418,314 issued to Nieto, Jr.;
U.S. Pat. No. 4,588,993 issued to Babij et al; and
U.S. Pat. No. 4,595,876 issued to Kuhara et al.

Weischedel discloses an electronic sensor having circuits for identifying electromagnetic radiation signals caused by nuclear detonations. A part of the patented sensor is formed by a rise time discriminator for the incoming signal.

Babij et al discuss a probe system for measuring the E- and H- field intensities of near-field electromagnetic radiation. By keeping the components electrically small the electromagnetic fields are not perturbed.

Nieto, Jr. shows a fast rise time, high voltage, high impedance voltage probe which allows the measurement of picosecond pulses. The probe of this patent utilizes a parallel R-C divider.

In Deno a low frequency electric field exposure monitor integrates personal exposure to an electric field into intervals Of electric field intensity. A broadband electric field sensor is shown in Kuhara et al.

Electric field sensors are useful for EMP monitoring in a nuclear environment for both ground based systems and for aircraft. These electric field sensors actually respond to the time derivative of the electromagnetic pulse, and may be categorized as differential type sensors. In practice, the use of a differential type sensor limits the overall sensor/scope bandpass to half of what it would be if a nondifferentiating sensor was used.

In view of the foregoing discussion, it is apparent that there currently exists the need for a self-integrating electric field sensor, which responds directly to the high power electric field of an EMP environment. The present invention is intended to satisfy that need.

SUMMARY OF THE INVENTION

The present invention is a self-integrating electric field sensor which provides a measure of electric fields directly, rather than indicating the field's time derivative. One embodiment of the invention is a self-integrating sensor, which includes: a disk electrode, and a probe response adjustment circuit, which provides an output signal to a conventional scope over an output electrode. When the disk electrode is charged by the electric field of an EMP, it conducts a current into the probe response adjustment circuit which is proportional to that charge. The probe response adjustment circuit adjusts the probe time constant so that is has a sufficient duration to measure the EMP electric field directly, rather than indicating the field's time derivative. This is accomplished in the manner discussed below.

The disk electrode, in one embodiment of the invention, is a flat disk about 1.5 inches in diameter which is connected by a central pin to the output electrode of the sensor. This disk has a small source capacitance of $C_S$ relative to the driving source by virtue of the electric field which impinges on its upper surface.

The probe response adjustment circuit is a load capacitor (of capacitance $C_L$) in parallel with a load resistor (with impedance $R_L$). This circuit is connected to a common electrical ground at one end, and to the disk electrode at the other end. Collectively, the disk electrode, load capacitor and load resistor have a response time (in seconds) given by $R_L C_L + R_L C_S$, where $R_L$ is measured in ohms, and $C_L$ and $C_S$ are measured in farads. The values of $R_L$ and $C_L$ are selected to provide a probe time constant with a sufficient duration to allow the probe to respond directly to the electric field, rather than its derivative. More specifically, typical conventional field sensors with RC decay times of 250 picoseconds and less are so fast, that they respond to the time derivative of changes in the incident field. The present invention is designed so that the sensor measures the actual time dependence of the perpendicular electric field for intensities from 1 to 1000 kV/m with an intrinsic bandpass of up to 2 GHz.

It is an object of the present invention to provide a self-integrating electric field sensor.

It is another object of the present invention to provide a means for EMP monitoring in a nuclear environment of aircraft and mobile or permanent ground base systems.

It is another object of the invention to provide electric field sensors for use in vulnerability; susceptibility, and lethality testing of electronic systems to transient electric fields.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is an electric field sensor which may, for example, be used to detect the electromagnetic pulse (EMP) which accompanies a nuclear explosion. It may also be used to detect the electric field associated with pulsed voltages in a wide variety of research fields.

Figure 1:
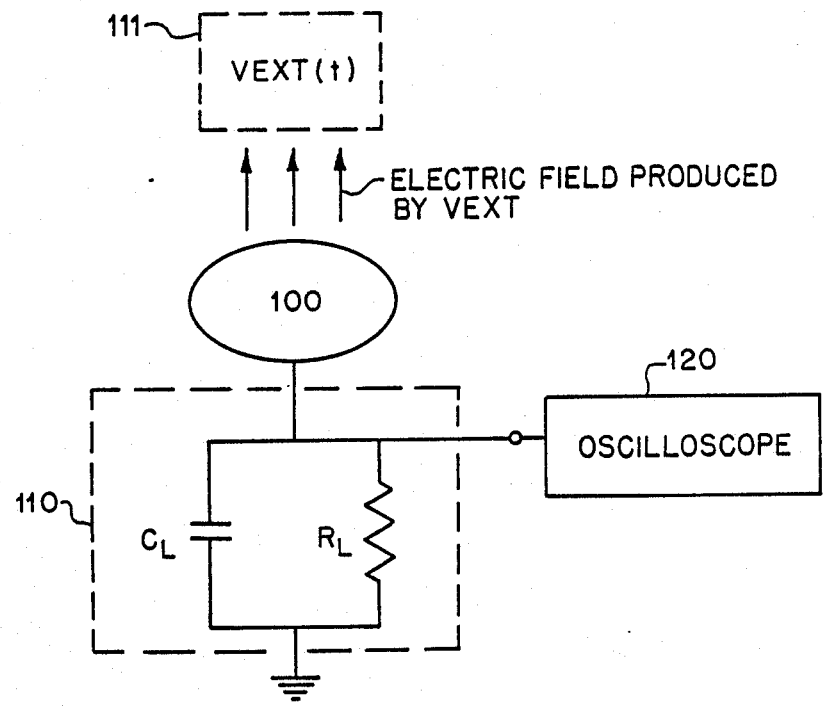
FIG. 1 is a schematic of an embodiment of the invention.

The reader's attention is now directed towards FIG. 1, which is a schematic of an embodiment of the invention which includes a disk electrode 100, and a probe response adjustment circuit 110 to provide an output signal to a conventional scope 120 which is a self-integrating direct measure of the ambient electric field, rather than the field's time derivative. The sensor couples to an external voltage source, indicated by a time dependent quantity $V_{ext}(t)$, through the electric field which impinges on the disk electrode 100.

Figure 2:
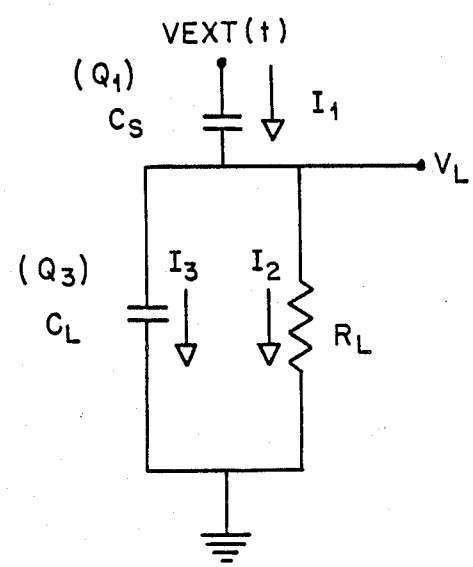
FIG. 2 is a schematic of an electrical circuit equivalent to the disk electrode and circuit of FIG. 1.
Figure 3:
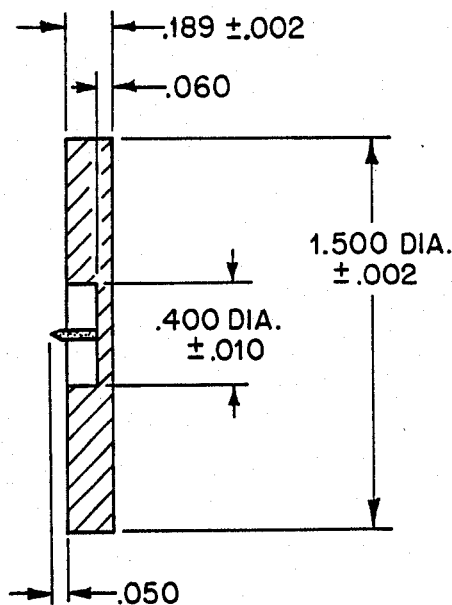
FIGS. 3 and 4 are side views of two disk electrodes which may be used in the system Of FIG. 1.
Figure 4:
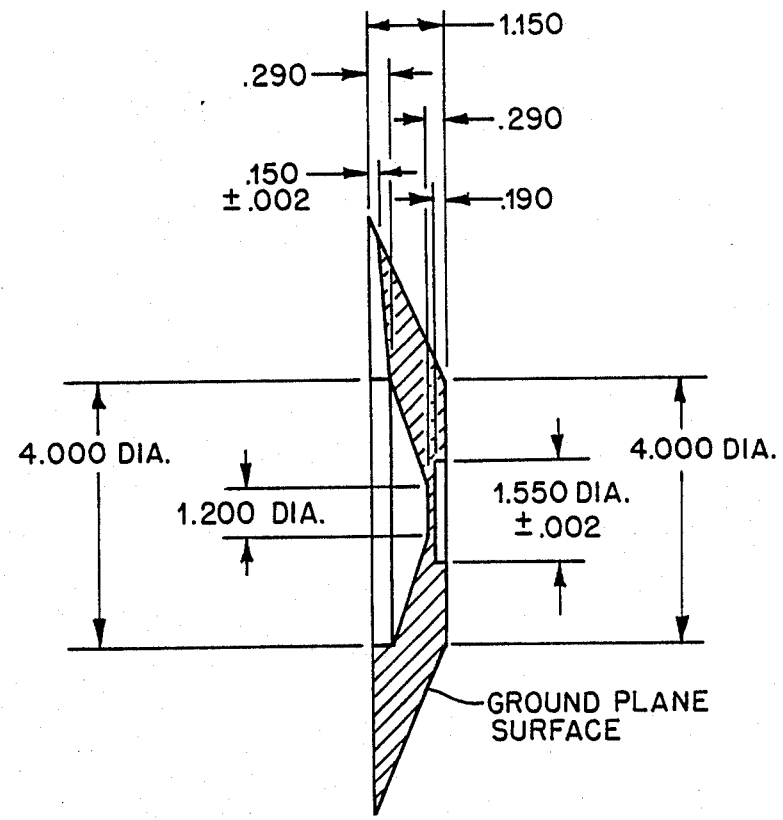

The disk electrode is composed of conventional materials which are electrically conductive, and has dimensions such as those depicted in FIGS. 3 and 4. In the event of a pulse of electromagnetic energy is incident on the probe, the disk electrode 100 becomes charged and conducts a current into the probe response adjustment circuit 110. The operation of the probe response adjustment circuit 110 is best understood by referring to the electrical schematic of FIG. 2.

Note that the oscilloscope 120 in FIG. 1 is a conventional means of displaying the output signal of the probe response adjustment circuit 110. It need not be described in further detail other than note that it is similar to the display systems used in the cited references.

FIG. 2 is an electrical schematic of a circuit which is electrically equivalent to the characteristics of the disk electrode 100, load capacitor $C_L$, load resistor $R_L$ and external voltage source $V_{ext}(t)$ 111 of the system of FIG. 5. The source capacitance $C_S$ is indicative of the capacitance between the upper surface of the disk electrode 100 and the external voltage source 111 of FIG. 1.

The purpose of FIG. 2 is to facilitate a description of the design principles of the present invention. As mentioned above, the presence of the electric field due to a pulse of electromagnetic energy charges the disk electrode with a charge $Q_I$. This charge $Q_I$ is related to the external voltage source $V_{ext}(t)$ which produced the pulse of electromagnetic energy by:

$$V_{ext}(t) = \frac{Q_1}{C_S} \tag{1}$$

where $C_S$ is the capacitance between the disk electrode 100 and the external voltage source 111 and is given in farads, and $V_{ext}(t)$ is given in volts.

From Kirchoff's current law it is apparent that:

$$I_1 = I_2 + I_3 \text{ and } I_3 = I_1 - I_2 \tag{2}$$

where: $I_1 = \dot{Q}_1$, $I_3 = \dot{Q}_3$, and the dot indicates differentiation with respect to time.

From Kirchoff's voltage law, it is apparent that:

$$\frac{Q_3}{C_L} = I_2 R_2 \text{ and } \frac{\dot{Q}_3}{C_L} = \dot{I}_2 R_L; \text{ and} \tag{3}$$

$$\frac{I_3}{C_L} = \dot{I}_2 R_L \tag{4}$$

therefore, it is apparent that $$V_{ext}(t) = \frac{Q_1}{C_S} + I_2 R_L \text{ and } \dot{V}_{ext}(t) = \frac{I_1}{C_S} + \dot{I}_2 R_L \tag{5}$$

From equation 4, it is apparent that $$\frac{I_1 - I_2}{C_1} = \dot{I}_2 R_L \tag{5}$$

From equation 5, it is apparent that $$I_1 = C_S \dot{V}_{ext}(t) - \dot{I}_2 R_L C_S \tag{6}$$

this means that:

$$\underbrace{C_S \dot{V}_{ext}(t) - \dot{I}_2 R_L C_S}_{I_1} - I_2 = R_L C_L \dot{I}_2 \tag{7}$$

Which implies:

$$\dot{I}_2 (R_L C_L) + I_2 + \dot{I}_2 R_L C_S = C_S \dot{V}_{ext}(t); \text{ and} \tag{8}$$

$$\dot{I}_2 \underbrace{(R_L C_L + R_L C_S)}_{= \tau_p} + I_2 = C_S \dot{V}_{ext}(t) \tag{9}$$

(Probe Time Constant)

With the probe time constant $\tau_p$ as defined in equation 9, equation 9 may be rewritten as:

$$\underbrace{\dot{I}_2 \tau_p}_{A} + \underbrace{I_2}_{B} = \underbrace{C_S \dot{V}_{ext}(t)}_{C} \tag{10}$$

The magnitude of quantities A, B and C can be estimated by replacing the time differentiation (the dot) by $1/t_r$, where $t_r$ is the signal rise time.

$$A = \dot{I}_2 \tau_p \approx \frac{I_2}{t_r} \tau_p = I_2 \frac{\tau_p}{t_r}; \tag{11}$$

$$B = I_2 \tag{12}$$

$$C = C_S \dot{V}_{ext}(t) \approx \frac{C_S V_{ext}(t)}{t_r} \tag{13}$$

Clearly, when $\tau_p/t_r$ is large compared with one (typically in the range of $10^2$–$10^4$), term A is much larger than term B. Thus, for this ordering, equation (10) becomes $I_2 = C_S \dot{V}_{ext}(t)$ (14) and so the current in the load, I2, is directly proportional to the external voltage source $V_{ext}(t)$. In other words, the sensor is "self-integrating". For conventional type sensors, term B is larger than term A, and so, with the neglect of term A, equation (10) becomes:

$$I_2 = C_S \dot{V}_{ext}(t) \tag{15}$$

or in other words, the sensor is differentiating. Note that from standard electromagnetic theory the quantity of the right-hand-side of equation (14), $C_S V_{ext}(t)$, is proportional to the electric field at the surface of the sensor, $E_S$. Thus, since the load voltage $V_L = I_3 T_L$, equation (14) can be rewritten as follows:

$$V_L = K E_S \tag{16}$$

where K is a constant related to the physical size of the sensor. Equation (16) shows that the voltage developed by the sensor $V_L$ is directly proportional to $E_S$ rather than its time derivative, where term A of equation (10) is much larger than term B, i.e., when the ratio $\tau_p/t_r$ is large compared with one.

A typical rise time $t_r$ of an impinging electric field might be on the order of 250 picoseconds. A conventional electric field sensor typically has a time constant $\tau_p$ less than the rise time of the electric pulse. The problem with a conventional sensor is its small $\tau_p$ causes it to output a signal that is tantamount to the time derivative of changes in ambient electric field, rather than the electric field itself. For this reason a conventional sensor may be deemed a differential type sensor.

The present invention differs from the conventional sensor in that its response time is selected to have a duration such that it responds directly to the electric field of an EMP rather than to its derivative. For this to occur, it is suggested that:

$$\frac{\tau_p}{\tau_r} \text{ range between } 10^2\text{-}10^4 \qquad (17)$$

The effect of equation 14 is made possible by the selection of $R_L$ and $C_L$ in the probe response adjustment circuit of FIGS. 1 and 2. As seen in equation 9, $$\tau_p = R_L C_L + R_L C_S. \qquad (18)$$

where:

$\tau_p$ is in seconds, $R_L$, is in ohms, and $C_L$ and $C_S$ are in farads.

A typical value for $R_L$ is 50 ohms, and using conventional design principles, $C_L$ would more commonly be selected to have a value of a few picofarads. However, in the design of the present invention $R_L C_L \gg t_r$, as indicated above in equation 14. Since the anticipated rise time of the electric field is expected to be on the order of 250 picoseconds, the value selected for $C_L$ would more typically range from about 500 picofarads up to 50 nanofarads when $R_L$ is about 50 ohms.

FIGS. 3 and 4 are side views of examples of disk electrodes that may be used in the present invention. The disk electrode of FIG. 3 is a circular disk with a diameter of 1.50 inches, and a thickness of $0.189 + 0.002$ inches.

At the center of the disk electrodes is a pin which has a diameter of 0.036 inches, and which electrically connects the disk electrode with the probe response adjustment circuit 110 of FIG. 1.

The electrodes of FIG. 1, 3 and 4 are all composed of conductive metals conventionally used as electrodes. These may include copper, aluminum, iron, steel, etc. Because $C_S$ is always much smaller than $C_L$, typically a tiny fraction of a picofarad, it is not necessary to know its value to design a probe. Rather, $C_L$ and $R_L$, of the probe response adjustment circuit may be selected such that the probe response time $\tau_p$ (as given by equation 15) has a ratio with the anticipated use time (of the EMP signal) as given by equation 17 under the assumption that $C_S = 0$. The result is an electric field sensor which provides a self integrating measure of the electric field directly, rather than the field's time derivative. The useful measurement time, which is the time over which the sensor carries out self-integration rather than differentiation is approximately 10 percent of $\tau_p$, since $\tau_p$ corresponds to the RC decay time of the sensor. Note that by increasing the load resistor from say 50 to 500 ohms, the value of $\tau_p$ can be increased by a factor of ten.

In implementing the design of the present invention, an electric field sensor has been constructed with an overall dimension of less than 5 cm Which can conform to an arbitrarily shaped conducting surface. The sensor measures the time dependence of the perpendicular electric field for intensities from 1 to 1000 kV/m with an intrinsic bandpass of up to 2 GHz.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. An electric field sensor which directly detects a pulsed electric field arising from a nuclear detonation and an electric field arising from any source of electrical potential, said pulsed electric field having a rise time and wherein said electric field sensor comprises:
   a disk electrode which is charged by said pulsed electric field and produces an electrical detection current therefrom;
   a probe response adjustment circuit which receives said electrical detection current from said disk electrode and outputs therefrom a measurement signal with a useful measurement time that is several orders of magnitude above the rise time of the pulsed electric field of the nuclear detonation, said probe response adjustment circuit thereby allowing direct measurement of the pulsed electric field of the electromagnetic pulse;
   an oscilloscope which receives and displays said measurement signal from said probe response adjustment circuit;
   an output electrode which is electrically connected to said disk electrode and said oscilloscope;
   a load resistor which is electrically connected between said disk electrode and a common electrical ground said load resistor having an impedance of $R_L$ ohms; and
   a load capacitor which is electrically connected between said disk electrode and said common electrical ground in parallel with said load resistor, said load capacitor having a capacitance of value $C_L$ farads such that $C_L R_L$ is a product which equals said useful measurement time in seconds which is several orders of magnitude larger than said rise time of said pulsed electric field.

2. An electric field sensor, as defined in claim 1, wherein said rise time of said pulsed electric field is from 250 picoseconds to 5 nanoseconds, and said useful measurement time ranges between about 250 nanoseconds and 25 microseconds.

3. An electric field sensor, as defined in claim 2, wherein $R_L$ ranges from about 50 ohms to 500 ohms and $C_S$ ranges between 500 picofarads and 50 nanofarads so that said response time allows a direct measurement of said pulsed electric field.

4. An electric field sensor, as defined in claim 3, wherein said disk electrode comprises:
   a conductive disk which has a center pin and a diameter of about 1.5 inches, and thickness of about 0.2 inches; and
   a pin fixed to the center of said conductive disk, said pin having a diameter of about 0.03 inches and connecting said conductive disk to said output electrode.

* * * * *